United States Patent [19]

Kitsukawa et al.

[11] Patent Number: 4,853,899

[45] Date of Patent: Aug. 1, 1989

[54] SEMICONDUCTOR MEMORY HAVING AMPLIFIER INCLUDING BIPOLAR TRANSISTOR

[75] Inventors: Goro Kitsukawa, Tokyo; Takao Watanabe, Kokubunji; Ryoichi Hori, Tokyo; Kiyoo Itoh, Higashikurume, all of Japan

[73] Assignee: Hitachi, Ltd., Tokyo, Japan

[21] Appl. No.: 276,947

[22] Filed: Nov. 28, 1988

Related U.S. Application Data

[63] Continuation of Ser. No. 929,345, Nov. 12, 1986, abandoned.

[30] Foreign Application Priority Data

Nov. 15, 1985 [JP] Japan ............................. 60-254747

[51] Int. Cl.⁴ .................... G11C 11/40; G11C 7/00
[52] U.S. Cl. .................................. 365/207; 365/190;
365/189.11; 365/177; 365/225.6; 307/530;
307/475
[58] Field of Search ............... 365/182, 177, 205, 207, 365/208, 190, 203, 233, 194; 307/475, 530

[56] References Cited

U.S. PATENT DOCUMENTS 4,604,533  8/1986  Miyamoto et al. ................. 365/208
4,616,342 10/1986  Miyamoto ........................... 365/205
4,665,505  5/1987  Miyakawa et al. ................. 365/190
4,713,796 12/1987  Ogive et al. ........................ 365/177

FOREIGN PATENT DOCUMENTS 0102218  3/1984  European Pat. Off. ............ 365/205
0210589 11/1984  Japan .
0224186 11/1985  Japan ................................. 365/227

OTHER PUBLICATIONS

Taniguchi et al, "Fully Boosted 64K Dynamic RAM with Automatic and Self-Refresh", IEEE Journal of Solid State Circuits, vol. SC-16, No. 5, Oct. 1981, p. 492+.

Primary Examiner—James W. Moffitt
Assistant Examiner—Glenn A. Gossage
Attorney, Agent, or Firm—Antonelli, Terry & Wands

[57] ABSTRACT

A semiconductor memory comprises a plurality of first data lines, a plurality of word lines disposed in such a manner as to intersect the first data lines, dynamic memory cells respectively disposed at the intersections between the word lines and the first data lines and including MOS transistors, a second data line connected to the first data lines through a switching circuit, an amplifier circuit connected to the second data line for detecting a read signal, and a write circuit for applying a write signal. The amplifier circuit includes at least one bipolar transistor.

5 Claims, 11 Drawing Sheets

SEMICONDUCTOR MEMORY HAVING AMPLIFIER INCLUDING BIPOLAR TRANSISTOR

This is a continuation of application Ser. No. 929,345, filed Nov. 12, 1986 now abandoned.

BACKGROUND OF THE INVENTION

The present invention relates to a circuit configuration of a sense amplifier and an output circuit designed to achieve high speed in operation of a dynamic random access memory (DRAM).

A typical conventional DRAM employs a basic circuit configuration such as that shown in FIG. 1 (see "LSI Handbook", pp. 486 to 498). More specifically, a memory cell (MC) is a dynamic memory cell consisting of an insulated-gate field effect transistor (MOS transistor) and a storage capacitance Cs. Although the circuit shown in FIG. 1 employs a 1TR-type cell, a 3TR- or 4TR-type dynamic cell is also employed in some cases. A memory cell array (CA) is formed by arranging a plurality of such cells in a matrix. FIG. 2 is a time chart showing the operation of the DRAM. The operation of the DRAM will be explained below with reference to FIGS. 1 and 2.

The reference symbol $\overline{CS}$ in FIG. 2 denotes a clock signal on the basis of which various pulses are generated inside the chip. FIG. 2 exemplarily shows a case where, when the $\overline{CS}$ is at a high level (High), the DRAM is in a stand-by state, whereas, when the $\overline{CS}$ is at a low level (Low), the DRAM is in an operating state. Under certain circumstances, it may be possible to adopt a method wherein changes in an address input are sensed, and various pulses are generated on the basis of the sensed changes, as shown in "'84 ISSCC", pp. 276 to 277. When the DRAM is in a stand-by state ($\overline{CS}$: High), data lines D and $\overline{D}$ are set at a voltage $V_H$ (e.g., ½ Vcc, where Vcc is supply voltage) by the operation of a precharge circuit (PC) in advance. When the DRAM is in an operating state ($\overline{CS}$: Low), the precharge circuit is off, and thereafter, a predetermined word line W is selected in response to an address input. In consequence, a MOS transistor for switching of a memory cell connected to the selected word line W turns on, and the data line potential changes in accordance with the amount of charge accumulated in the storage capacitance Cs, that is, data stored therein. Thereafter, the sense amplifier SA and an active restore circuit AR are activated to amplify the data line potential to a level which is substantially equal to the supply voltage Vcc or the ground-level. Although SA and AR are herein shown separately from each other due to the convenience of explanation, these may be given a general term "sense amplifier", and various circuit configurations may be employed therefor. Then, a predetermined $\phi_Y$ is selected in response to an address signal to thereby turn on MOS transistors $MY_1$ and $MY_2$ or switching. Thus, a voltage difference is produced between a pair of common data lines I/O and $\overline{I/O}$ in accordance with the respective potentials of the two selected data lines D and $\overline{D}$. This voltage difference is amplified by a main amplifier MA. For writing, a write circuit WC is controlled by $\phi_W$ so as to allow the pair of common data lines I/O and $\overline{I/O}$ an have potentials corresponding to data inputs di and $\overline{di}$, respectively, thereby writing desired data in a memory cell via a selected data-line. It should be noted that the input/output signal levels in FIG. 2 are set on the assumption that they are used for a TTL (Transistor-Transistor-Logic) interface, and in the case of an ECL (Emitter Coupled Logic) interface, input/output signal levels may be set as follows: −0.9 V for the high level; −1.7 V for the low level; GND (0 V) for the positive side of the supply voltage; and $V_{EE}$ (−5.2 V) for the negative side of the supply voltage. $\overline{CS}$ is a control signal for the memory, as described above, which switches a stand-by state and an operating state one from the other. In an address multiplexing memory, two signals, known as $\overline{RAS}$ (Row Address Strobe) and $\overline{CAS}$ (Column Address Strobe) are employed in place of $\overline{CS}$ (Chip Select).

In the conventional DRAM, a signal which is read out to the common data lines is amplified by a main amplifier and an output circuit, which employ MOS transistors. It is a known fact that a MOS transistor has a relatively small amount of change in drain current with respect to a change in the gate voltage, that is, the mutual conductance $g_m$ of the MOS transistor is relatively small. In consequence, it was impossible, in the prior art, to achieve both high sensitivity and high speed in amplification of the signal read out to the common data lines.

SUMMARY OF THE INVENTION

The present invention aims at detecting a small voltage difference read out to a pair of common data lines IO and $\overline{IO}$ from a selected data-line with high sensitivity and at high speed by means of a differential amplifier including a bipolar transistor.

Accordingly, it is an object of the present invention to provide a semiconductor memory which enables data to be read out at high speed.

According to the present invention, it is possible to obtain a necessary output voltage in a bipolar output circuit posterior to a sense amplifier without the need to form the sense amplifier using cascaded circuits arranged in a multistage configuration, and to achieve high speed by virtue of a reduced signal voltage and a decreased number of cascaded circuits.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

The present invention will be described hereinunder in detail by way of embodiments.

[Embodiment 1]

Figure 1:
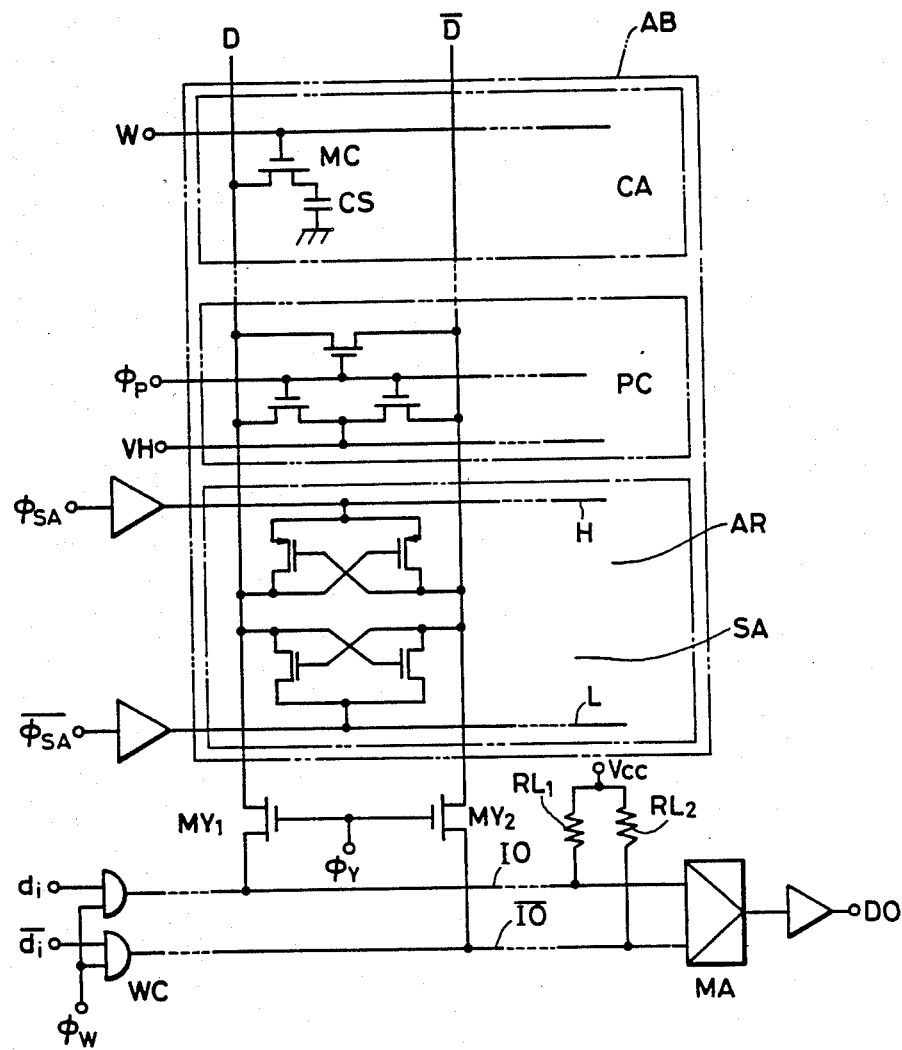
Figs. 1 and 2 show in combination a prior art.
Figure 3:
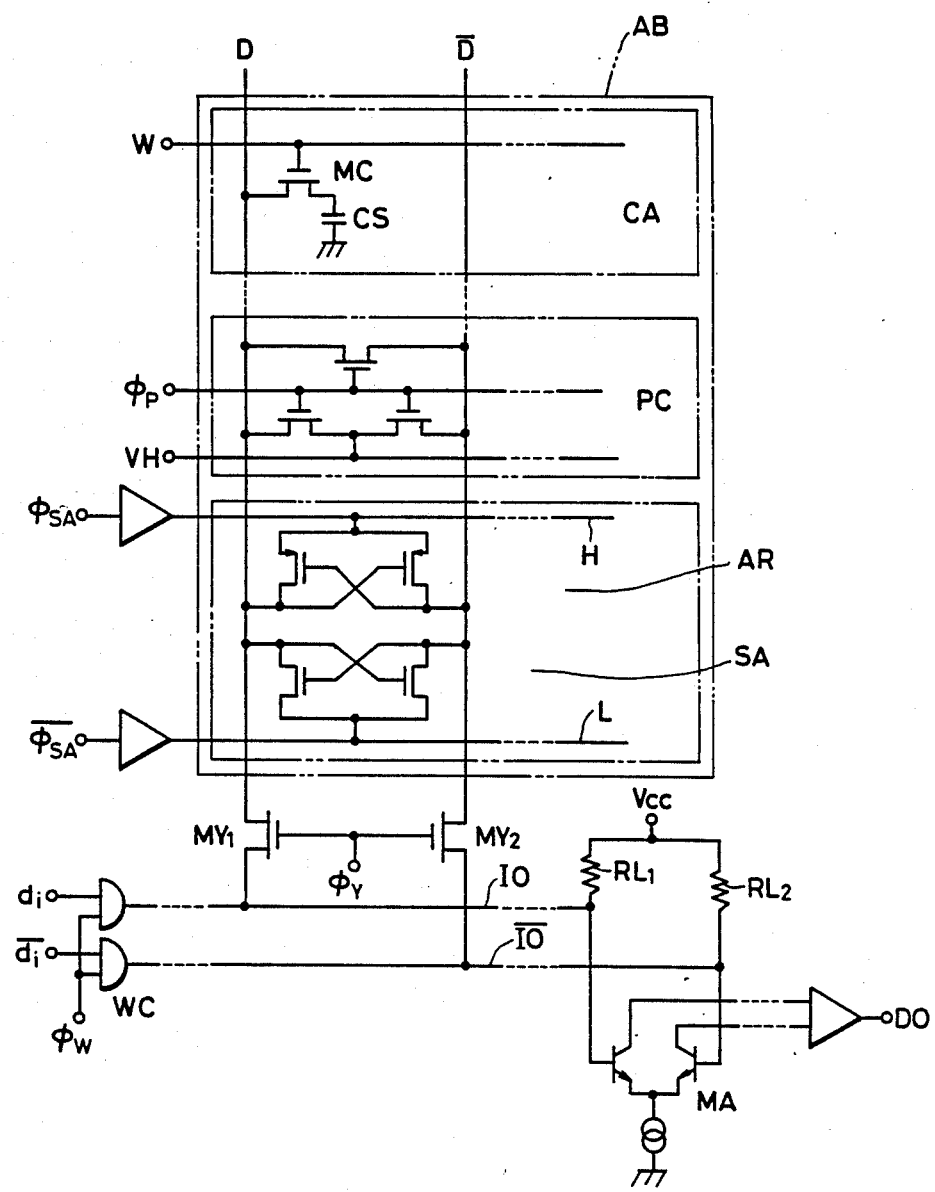
FIG. 3 is a circuit diagram showing a first embodiment of the present invention.
Figure 4A:
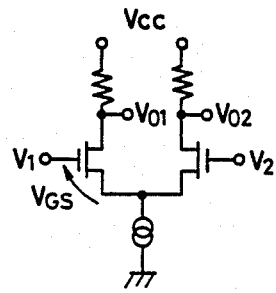
FIGS. 4A to 4C are views employed to make comparison between the present invention and the prior art.
Figure 4B:
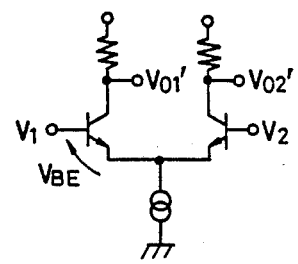
Figure 4C:
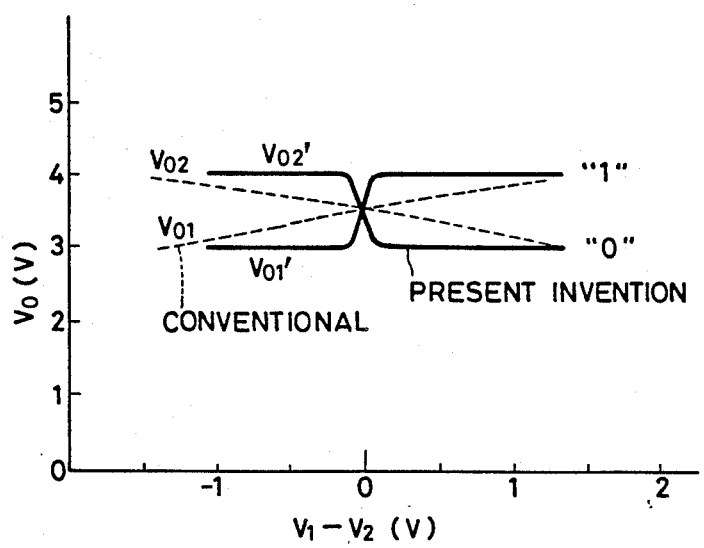

FIG. 3 is a circuit diagram of an embodiment which shows a fundamental arrangement of the present invention. In FIG. 3, a memory cell array CA, a sense amplifier SA, an active restore circuit AR and a precharge circuit PC are common to those of the prior art shown in FIG. 1. For reading, after the sense amplifier SA and the active restore circuit AR have been started to operate, a word line is selected by $\phi_Y$. In consequence, a current flows from one of the load resistors $R_{L1}$ and $R_{L2}$ respectively provided on a pair of common data lines toward the one of the data lines D and $\overline{D}$ which has a lower voltage than that of the other, so that one of the common, data lines has a relatively high potential, while the other has a relatively low potential. This voltage difference is amplified by a bipolar differential amplifier MA and delivered to a cascading circuit. Since the bipolar differential amplifier MA has relatively high sensitivity, it is able to effect current switch substantially completely with a base voltage difference on the order of 0.1 V. Accordingly, the bipolar amplifier MA starts to operate as soon as the signal voltage on the common data lines changes slightly. FIGS. 4A to 4C are used to make comparison between the present invention and the prior art.

FIG. 4A shows the circuit configuration of an essential part of the main amplifier 4A according to the prior art, while FIG. 4B shows the circuit configuration of an essential part of the main amplifier MA according to the present invention, and FIG. 4C shows respective input-output transfer characteristics of these circuits, the broken lines showing the characteristics of the prior art circuit, and the solid lines showing the characteristics of the circuit of the present invention. In the graph shown in FIG. 4C, the axis of abscissas represents the differential input voltage $V_1 - V_2$ (the voltage between I/O and $\overline{I/O}$) of the main amplifiers MA, and the axis of ordinates represents the output voltage of the main amplifiers MA. As will be clear from FIG. 4C, the output of the main amplifier MA according to the present invention is amplified to a predetermined level representing "0" or "1" in response to a slight differential input voltage. In other words, it is possible to greatly increase the level of sensitivity of the main amplifier MA. This is because a bipolar transistor is much greater than a MOS transistor in terms of mutual conductance $g_m$, that is, the rate of increase in the output current with respect to an increase in the input voltage: the rate of increase in drain current $I_D$ with respect to an increase in gate-source volta $V_{GS}$ in the case of the former; and the rate of increase in collector current $I_C$ with respect to an increase in base-emitter voltage $V_{BE}$ in the case of the latter. More specifically, as shown in FIG. 4C, the sensitivity of the differential amplifier becomes higher as the ratio between currents respectively flowing through a pair of transistors increases with respect to a predetermined input voltage. The current ratio increases substantially in proportion to the mutual conductance $g_m$ of the transistors, and the mutual conductance $g_m$ of bipolar transistors is much greater than that of MOS transistors. For this reason, it is possible to increase the sensitivity of the differential amplifier by a large margin. The difference in terms of mutual conductance $g_m$ depending on kinds of transistor may be explained as follows:

The drain current $I_D$ of a MOS transistor may be represented by the following formula:

$$I_D = \beta/2(V_{GS} - V_{TH})^2 \quad (1)$$

In the formula (1): $\beta$ and $V_{TH}$ respectively denote the channel conductance and threshold voltage of the MOS transistor; and $V_{GS}$ represents the gate-source voltage thereof. On the other hand, the collector current of a bipolar transistor may be represented by the following formula:

$$I_C = I_S \exp\frac{qV_{BE}}{kT} \quad (2)$$

ps In the formula (2): $I_S$ denotes saturation current; k, Boltzman constant; q, electronic charge; T, absolute temperature; and $V_{BE}$, and base-emitter voltage. As will be understood from the above, $I_D$ changes in proportion to the square of $V_{GS}$, whereas $I_C$ changes exponentially with $V_{BE}$. Accordingly, the mutual conductance of the bipolar transistor increases by a large margin, so that it is possible to greatly increase the ratio between currents respectively flowing through the above-described pair of transistors. For example, when the differential input voltage for transistors in general integrated circuits is assumed to be 0.1 V, the current ratio of a MOS transistor is 1.5/1, whereas that of a bipolar transistor is 20/1. In consequence, a main amplifier employing a bipolar transistor has extremely high sensitivity.

As has been described above, it is possible, according to the present invention, to increase the sensitivity of the main amplifier MA to a level considerably higher than that of the prior art. It is therefore possible to start amplification as soon as a slight read signal appears on the common data lines I/O and $\overline{I/O}$. Accordingly, it is possible to achieve considerably high speed. Further, since a high sensitivity main amplifier MA is employed, the signal voltage difference of the common data lines I/O and $\overline{I/O}$ during reading can be set at a very small values so that it is possible to greatly reduce the access time, that is, the time required for a read signal to change from "1" to "0" or from "0" to "1".

[Embodiment 2]

In the above-described embodiment 1, in a writing operation, $\phi_W$ is raised to a high level, while the common data lines are brought to low and high levels, respectively, in accordance with di and $\overline{di}$, and the potentials of the data lines D and $\overline{D}$ are changed in accordance with write data through MOS transistors $MY_1$ and $MY_2$ for column selection. At this time, to drive the I/O line so as to have a large signal voltage by the write circuit WC thereby to write a relatively large voltage in a memory cell in order to obtain a stable operation, the resistors $R_{L1}$ and $R_{L2}$ preferably have a relatively large resistance value. Thus, the values of the resistors $R_{L1}$ and $R_{L2}$ are preferably set at a relatively small value for reading in order to decrease time constant and achieve high speed, but preferably set at a relatively large value for writing. For this reason, the resistors $R_{L1}$ and $R_{L2}$ are preferably constituted by variable resistors. This can readily be realized by constituting the load resistors by MOS transistors and controlling the gate voltage of each of them.

Figure 5:
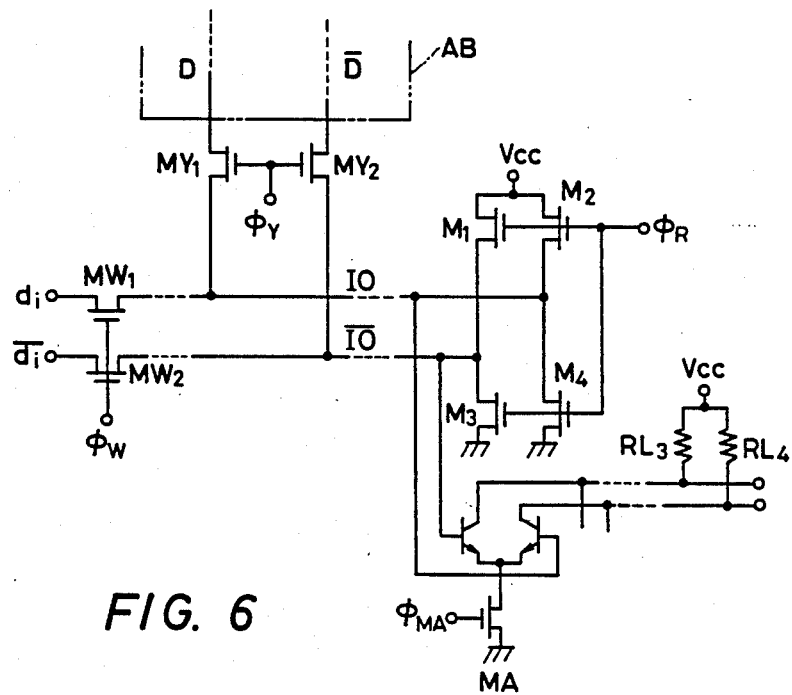
FIG. 5 is a circuit diagram showing a second embodiment of the present invention.

FIG. 5 shows the second embodiment of the present invention in which the load resistors shown in FIG. 3 are realized by employing MOS transistors. This embodiment differs from the first embodiment shown in FIG. 3 in that the load resistors are constituted by MOS transistors $M_1$ to $M_4$, and the current source for the bipolar differential amplifier is arranged so that it can be turned on and off in response to $\phi_{MA}$. The write driver is also practically constituted by MOS transistors. For reading, $\phi_R$ is set at High, while $\phi_W$ is set at Low, and the equivalent resistance of the MOS transistors $M_1$ and $M_2$ is thereby decreased to quicken the response of the common data lines. In reading, the data line voltage on the high level side is $V_{CC}-T_{TH}$, while the data line voltage on the low level side is $V_{CC}-V_{TH}-I_{SA} \cdot R$. R represents the equivalent resistance of $M_1$ and $M_2$, and $I_{SA}$ represents a current flowing through the sense amplifier of the data line through the MOS transistor for column selection.

During reading, the low level of the data lines is raised by a current supplied by $M_1$ or $M_2$. Therefore, to set the rewriting voltage to a memory cell at 0 V, it is necessary to turn off $\phi_Y$ after the detecting operation of the main amplifier has finished, in a manner similar to that in the conventional DRAM. For writing, $\phi_W$ is set at High, while $\phi_R$ is set at Low, and data is thereby written in a memory cell on a selected data line in accordance with di and $\overline{di}$. At this time, the equivalent resistance of $M_1$ and $M_2$ is increased by setting $\phi_R$ at Low level, thereby allowing the lower side of the common data lines to be readily lowered. Thus, it is possible to simultaneously realize a high-speed read operation and a stable operation. Further, the collector output terminal of the bipolar differential amplifier MA is connected with a plurality of other collector output terminals. In this arrangement, when, for example, the memory cell array is divided into a plurality of sub-arrays and a bipolar differential amplifier is provided for each sub-array, only the differential amplifiers which belongs to a selected sub-array are turned on in response to $\phi_{MA}$, whereby it is possible to take out only the data stored in the selected sub-array as a collector output.

[Embodiment 3]

Figure 6:
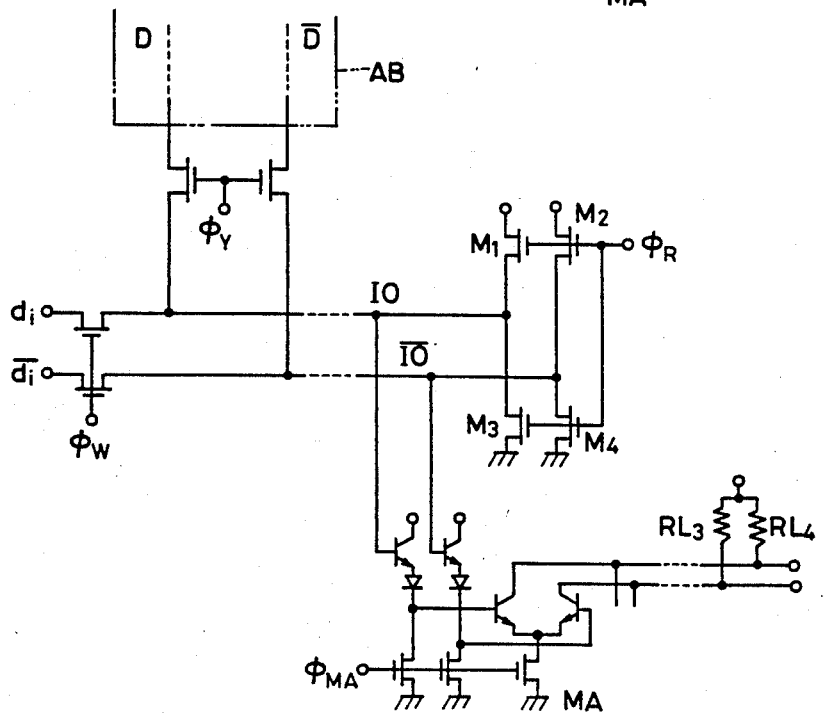
FIG. 6 is a circuit diagram showing a third embodiment of the present invention.

The embodiment shown in FIG. 6 is formed by additionally connecting a level shift circuit using an emitter-follower and a diode to each of the base input terminals of the bipolar differential amplifier in accordance with the embodiment shown in FIG. 5 in order to prevent the bipolar transistor from being saturated. By virtue of this arrangement, even when High level of the common data lines I/O and $\overline{I/O}$ is equal to the voltage $V_{CC}$, since the base input voltage of each bipolar transistor is lowered to $V_{CC}-2V_{BE}$, no bipolar transistor is saturated. Thus, it is possible to completely prevent saturation of the bipolar transistors, so that it is possible to realize a high-speed memory.

[Embodiment 4]

Figure 7:
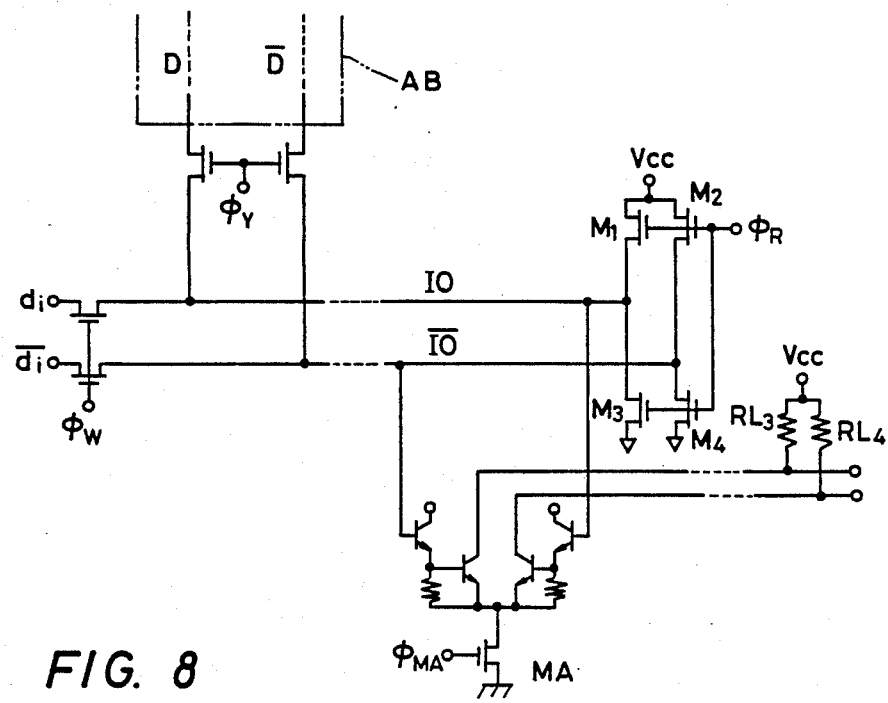
FIG. 7 is a circuit diagram showing a fourth embodiment of the present invention.

FIG. 7 shows a further embodiment of the present invention in which the above-described level shift circuit for preventing saturation is formed by Darlington connection of bipolar transistors.

Thus, it is possible to obtain advantages similar to those offered by the arrangement shown in FIG. 6.

[Embodiment 5]

Figure 8:
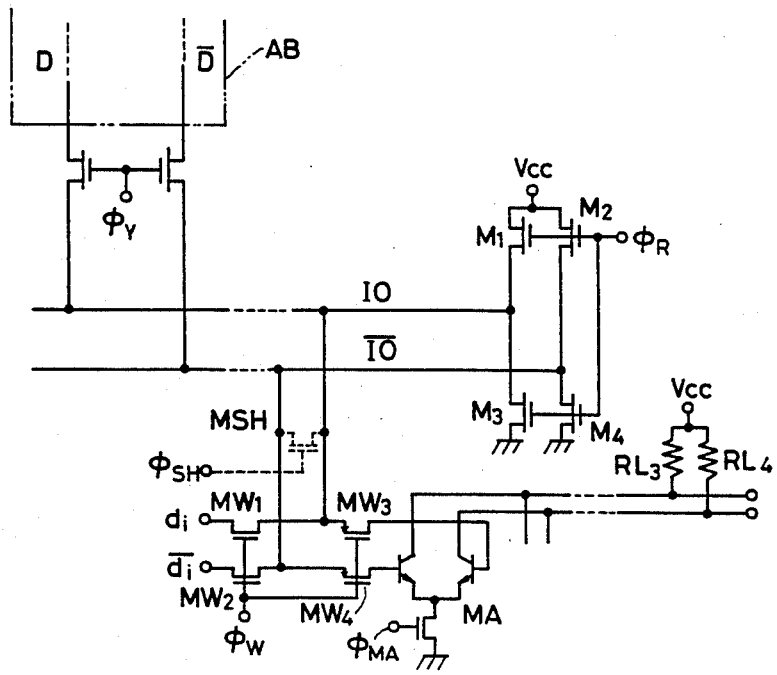
FIG. 8 is a circuit diagram showing a fifth embodiment of the present invention.

The embodiment shown in FIG. 8 features a switch constituted by MOS transistors $M_{W3}$ and $M_{W4}$ which is additionally provided between the base input terminal of the bipolar differential amplifier and the common data lines in order to prevent saturation of bipolar transistors. If $M_{W3}$ and $M_{W4}$ are constituted by p-channel MOS transistors, the gate signal $\phi_W$ for the write circuit can also be used as a control signal for $MW_3$ and $W_{W4}$. When $M_{W3}$ and $M_{W4}$ are constituted by n-channel MOS transistors, it suffices to apply a signal opposite in phase to $\phi_W$. During writing, even when $\phi_W$ is raised to High level and High level of one of the data inputs di and $\overline{di}$ appears on the common data lines, since $M_{W3}$ and $M_{W4}$ are off, there is no fear of the bipolar transistors being saturated. Since High level of the common data lines during reading is $V_{CC}-V_{TR}$, if this level is applied to the respective bases of the bipolar transistors through $M_{W3}$ and $M_{W4}$, the bipolar transistors may be saturated. However, it is comparatively easy to design the bipolar differential amplifier and the load resistors thereof so that the bipolar transistors are not saturated in such situation. Thus, there is no fear of the bipolar transistors being saturated during reading and writing.

Figure 2:
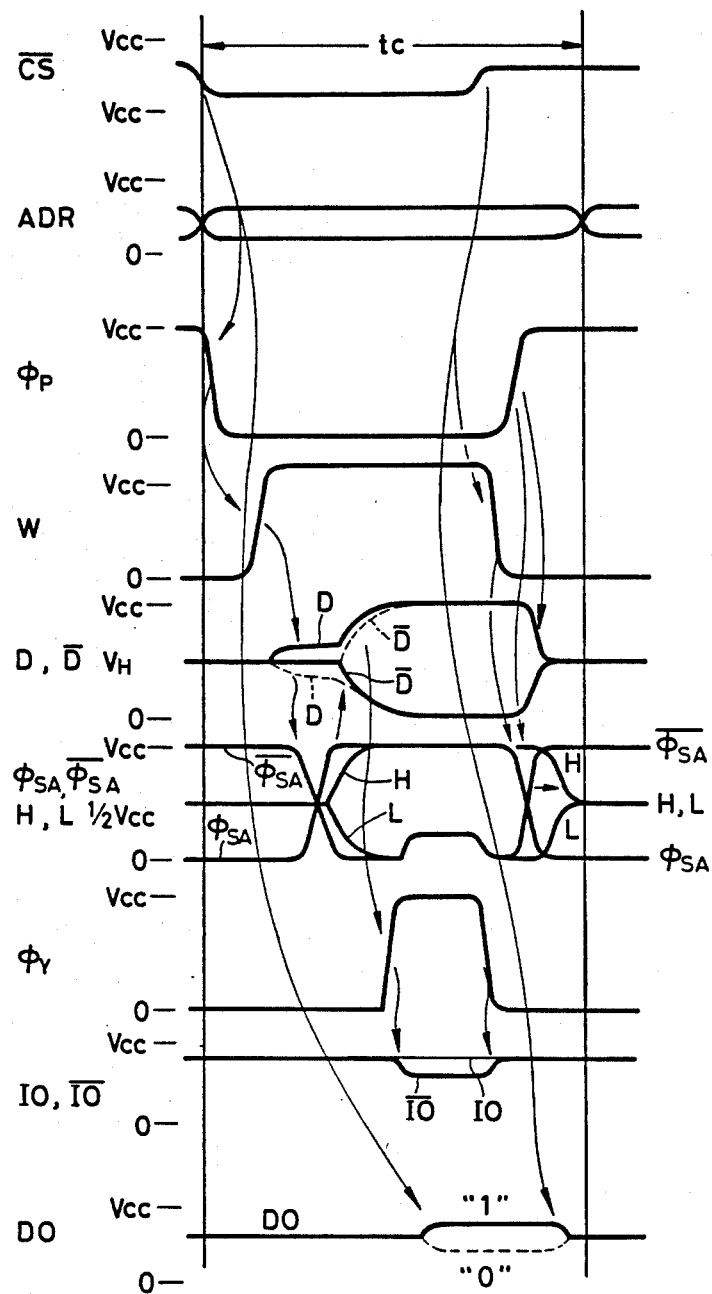

In the description of the above embodiments shown in FIGS. 3 to 8, no mention has been made of timing at which $\phi_Y$ is turned on. In the method wherein data lines and common data lines are connected by the operation of the MOS transistors $MY_1$ and $MY_2$ for column selection the method being employed in the above-described embodiments in common and also shown in FIG. 1, it is necessary for $\phi_Y$ to be turned on after a word line has been selected and then the sense amplifier SA and the active restore circuit AR have been activated, as shown in the time chart of FIG. 2. This is because, if $\phi_Y$ is turned on before the sense amplifier SA and the active restore circuit AR are activated, since common data lines generally have a relatively large parasitic capacitance, a signal which is read out to a data line from a memory cell may decay to lead to an induce error. It takes 30 ns to 50 ns for a data line signal to reach a stationary level from the start of the operation of the sense amplifier SA and the active restore circuit AR.

Accordingly, in the conventional DRAM, $\phi_Y$ is turned on after the potential of the data line has been raised to, e.g., about $V_{CC}-V_{TH}$, and this obstructs achievement of high speed, together with the operation of the main amplifier MA constructed by MOS transistors described above.

Figure 9:
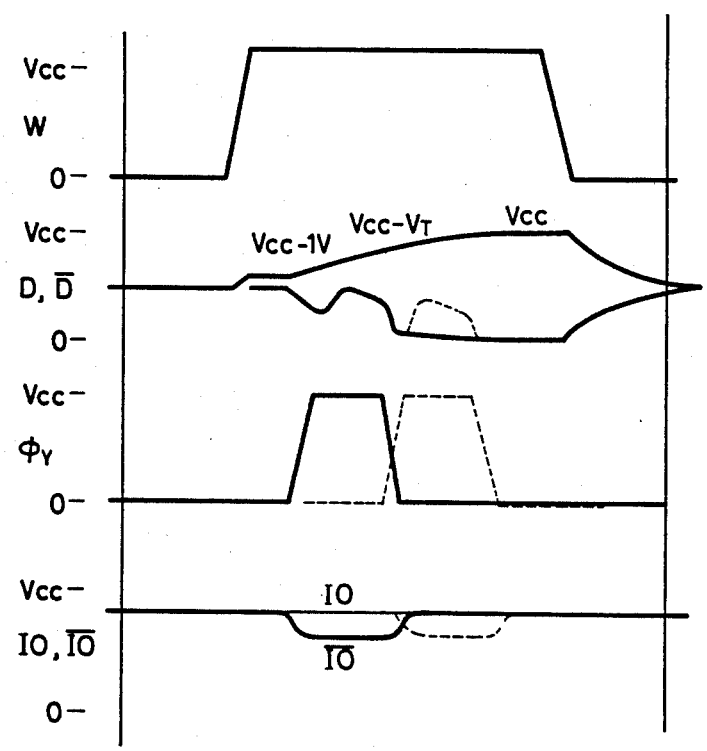
FIG. 9 shows an operation timing diagram of the present invention.

According in the present invention, $\phi_Y$ is preferably turned on after the sense amplifier SA and the active restore circuit AR have been turned on to start amplification of the data line potential and before the High-level side of the data lines reaches ($V_{CC}-1$ V ($V_{CC}$ being an example of a normal value) as shown by the solid lines in FIG. 9, whereby it is possible to achieve higher speed. In FIG. 9, one example of the operation timing of the conventional DRAM is shown by the broken lines. When $\phi_Y$ is turned on at an advanced phase as shown by the solid line, it is possible to obtain a read signal on the common data lines at a correspondingly advanced timing. In this case, the voltage difference obtained between the common data lines is decreased. However, it is possible to satisfactorily detect even a small voltage difference because the bipolar amplifier is highly sensitive. For writing also, the timing at which $\phi_Y$ is turned should be set in a manner similar to that for reading. Thus, it is possible to reduce both the delay time involved in reading (the time having an effect on the access time) and the time required for writing (the time having an effect on the cycle time), so that it is possible to attain a substantial reduction in the access time and cycle time of the DRAM, in addition to the above-described achievement of high speed by the use of bipolar transistors.

In the above-described embodiments, the base current for bipolar transistors constituting the main amplifier MA is supplied from the load resistors $R_{L1}$ and $R_{L2}$ connected to the common data lines I/O and $\overline{I/O}$ as shown in FIG. 3. However, the base current may be supplied from the active restore circuit AR in the memory cell array. In such case, the active restore circuit AR may be activated before the sense amplifier SA is activated in order to increase the capacity of supplying the base current to the bipolar transistors from $V_{CC}$.

Figure 10:
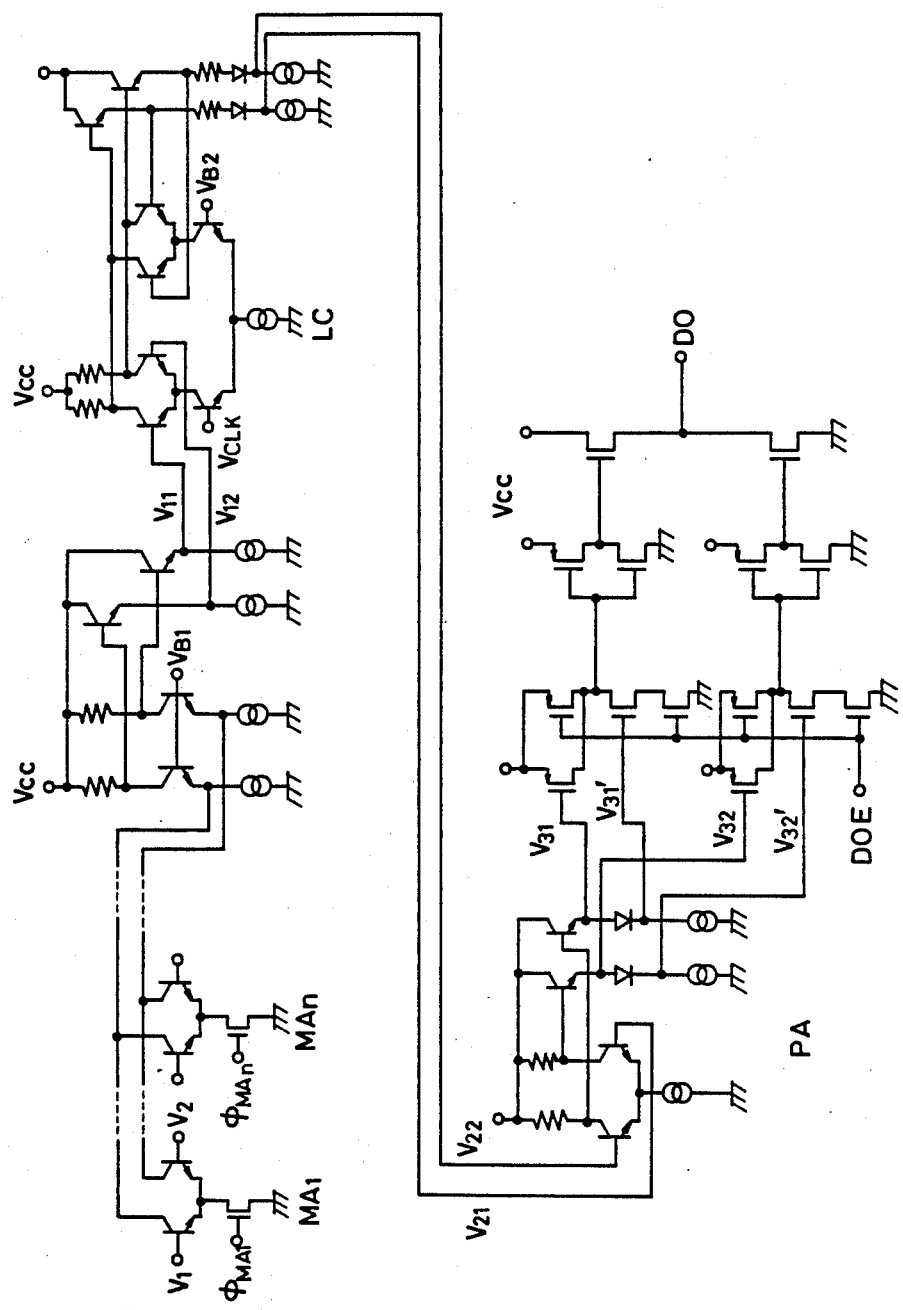
FIGS. 10 and 11 show in combination a sixth embodiment of the present invention.
Figure 11:
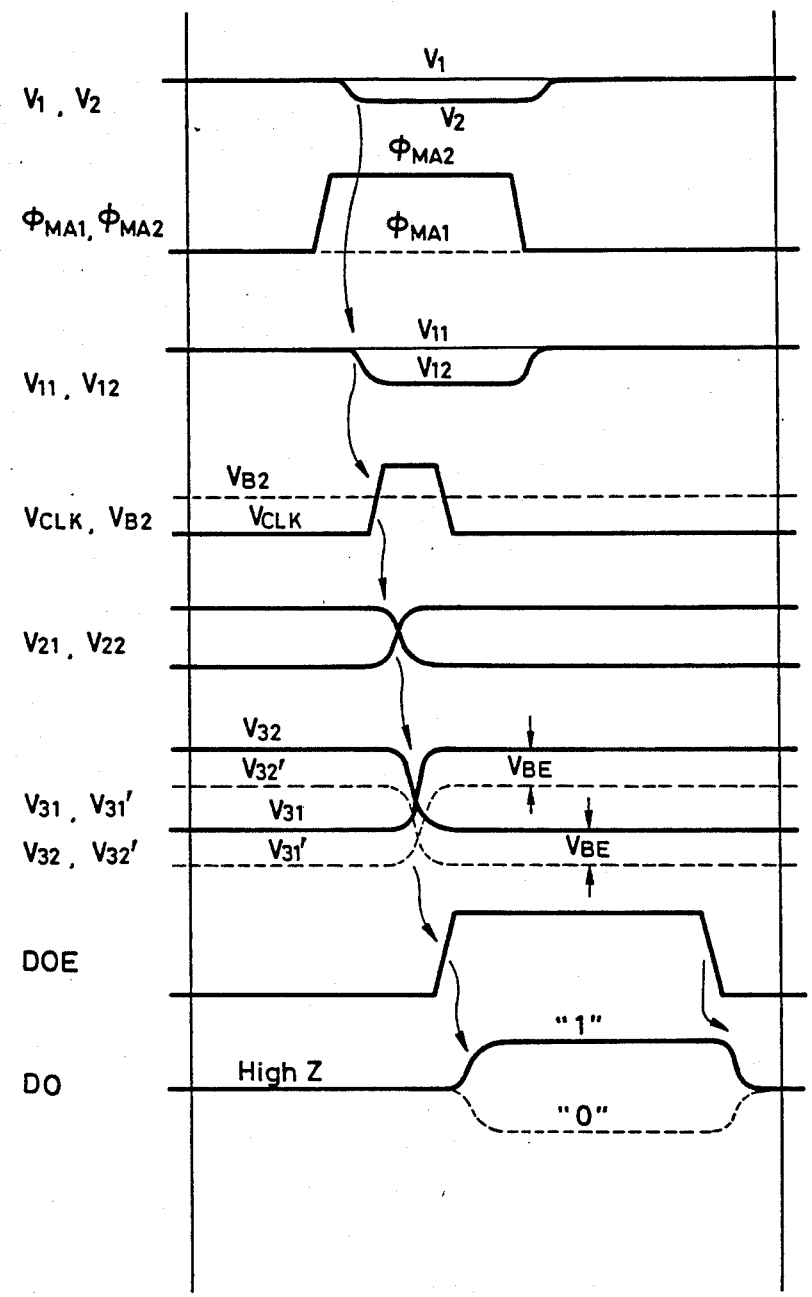

The circuit configuration of a main amplifier employing bipolar transistors for detecting a common data line signal has been described above. The circuit configuration of a circuit portion which is disposed posterior to the main amplifier and leads to the data output will be explained below. FIG. 10 shows one example of the TTL interface, circuit configuration posterior to the main amplifier and FIG. 11 shows waveforms related to the operation thereof. The reference symbols $MA_1$ to $MA_n$ denote the above-described main amplifiers which are constituted by bipolar differential amplifiers and ON/OFF controlled in response to $\phi_{MA1}$ to $\phi_{MAn}$. A latch circuit samples a signal read out from the memory cell array during the period when $V_{CLK}$ is at High level, and holds it during when $V_{CLK}$ is at Low level. Accordingly, it is possible to hold read data even after the selected word line has been brought to a non-selective state. A level translator PA amplifies an input signal voltage of 0.3 to 0.6 V to about 3 V and generates a complete MOS level signal in a CMOS section on the output side thereof. The reference symbol DOE denotes an output control signal which is brought to Low level during a stand-by or writing cycle to allow an output terminal to have a high impedance. When DOE is changed to High level, DO takes a value corresponding to a signal read out from a memory cell. It should be noted that the level transistor PA is formed by utilizing the arrangement disclosed in Japanese Patent Application No. 139661/1984 which has already been filed, and various methods of taking an output have also already been proposed in which bipolar and MOS transistors are combined, as mentioned in the specification of the above-described patent application.

It is also possible to constitute the circuit portion posterior to the level transistor PA by bipolar transistors alone.

Thus, the main amplifier MA and leads the output circuit is formed using bipolar transistors as main constituent elements and therefore is able to operate at extremely high speed.

[Embodiment 6]

Figure 12:
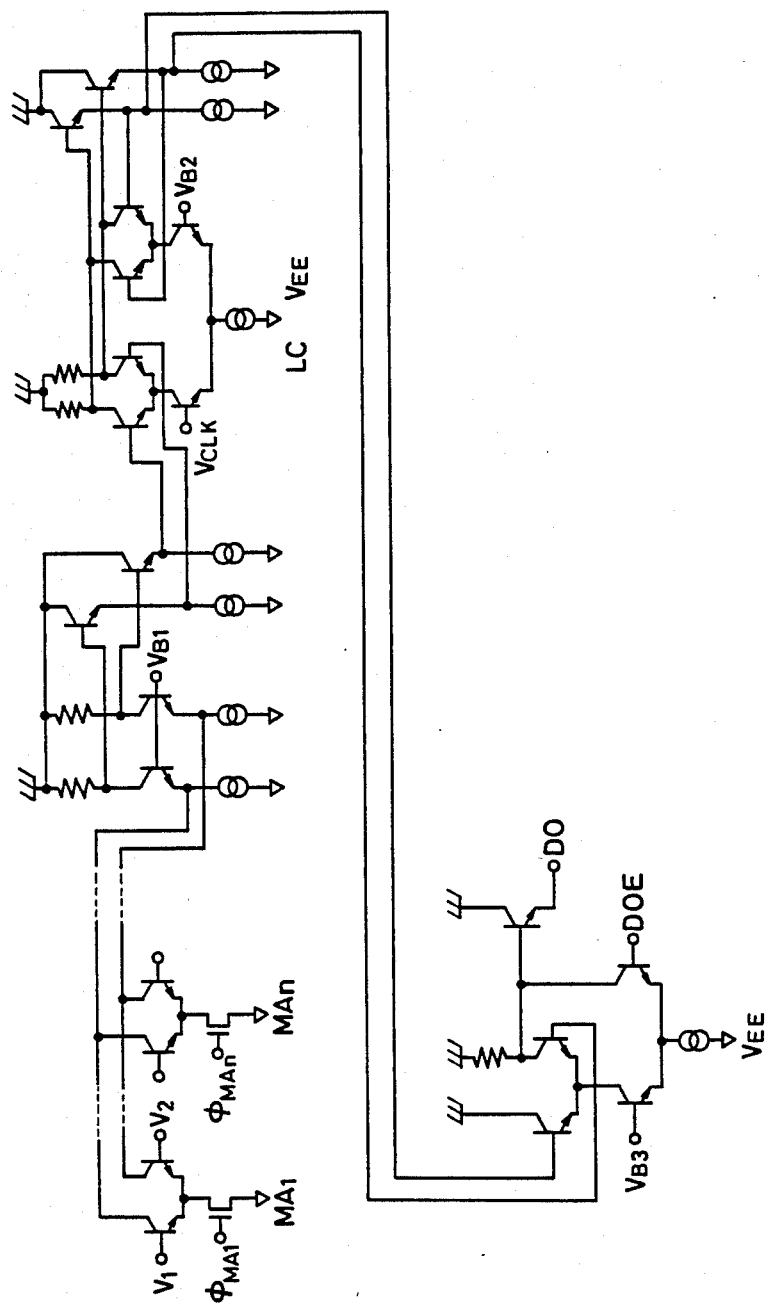
FIG. 12 is a circuit diagram showing a seventh embodiment of the present invention.

FIG. 12 shows a circuit configuration of the output circuit posterior to the main amplifier in the case of an ECL interface. In this case, the circuit posterior to the main amplifier is constituted by bipolar transistors alone. The operation of the latch circuit and the function of the DOE are realized simultaneorssly as shown in FIG. 10. In the ECL interface, however, it is general practice to raise the DOE signal to High level and set the DO output at Low level in a stand-by or writing state. In reading, the DOE signal is changed to Low level, and the DO output is brought to High or Low level in accordance with data read out from a memory cell. Since it is unnecessary, in the embodiments shown in FIGS. 10 and 12, to amplify the signal voltage output from the main amplifier MA to supply voltage level, both the main amplifier MA and the latch circuit LC are able to operate at high speed.

[Embodiment 7]

Figure 13:
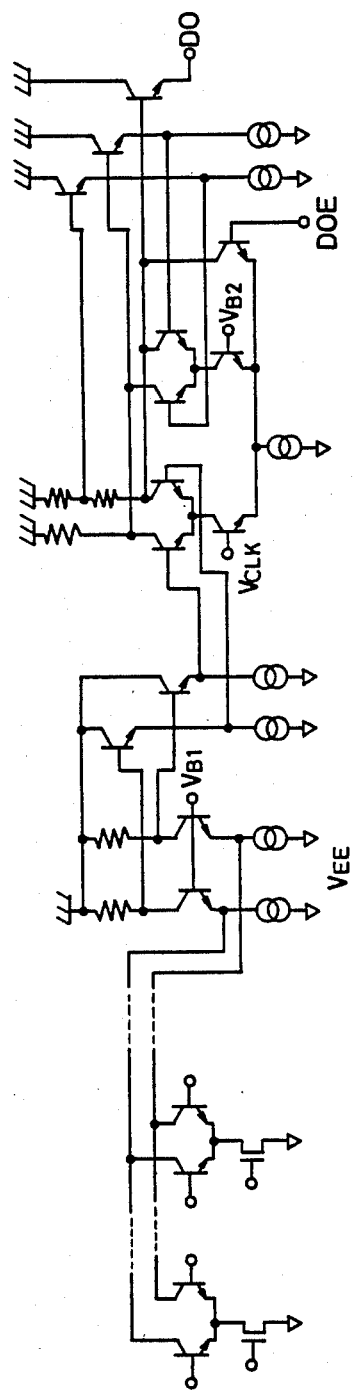
FIG. 13 is a circuit diagram showing an eighth embodiment of the present invention.

The embodiment shown in FIG. 13 differs from the embodiment shown in FIG. 12 in that the latch and output circuits in the arrangement shown in FIG. 12 are combined together in one circuit. The operation of this circuit is similar to those of the embodiments shown in FIGS. 10 and 12, and detailed description thereof is therefore omitted. In this embodiment, since the latch and output circuits are combined to reduce the number of cascaded circuits, it is possible to achieve higher speed.

As has been described above, a DRAM is formed by employing a memory cell array and common data lines which are commonly used in conventional DRAM's, and the present invention is applied to the main amplifier and the output circuit in the DRAM to greatly reduce the access time and thereby to achieve high speed. More specifically, it is possible to reduce the access time of the DRAM to about $\frac{1}{3}$ and the cycle time to about $\frac{1}{2}$. On the other hand, there is substantially no increase in the chip area, since the memory cell array and the direct peripheral circuits thereof are formed using completely the same configuration as that in the conventional MOSDRAM and it is only necessary to use bipolar transistors for a relatively small number of indirect peripheral circuits.

It is further understood by those skilled in the art that the foregoing description is a preferred embodiment of the disclosed device and that various changes and modifications may be made in the invention without departing from the spirit and scope thereof.

What is claimed is:

1. A semiconductor dynamic memory comprising:
   a plurality of first data lines;
   a plurality of word lines disposed in such a manner as to intersect said first data lines;
   dynamic memory cells disposed at the intersections between said word lines and said first data lines, wherein each of said dynamic memory cells includes a MOS transistor connected at its gate electrode to a corresponding word line, and a capacitor connected at one electrode thereof to a corresponding first data line through a drain-source path of said MOS transistor;
   a sense amplifier and active restore circuit means coupled to said first data lines for amplifying signals stored in said dynamic memory cells, said sense amplifier and active restore circuit means being formed by MOS transistors, wherein amplifying and active restoring operations of said sense amplifier and active restore circuit means are started by a first control signal;
   a second data line connected to said first data lines through switching means so that read signals from said dynamic memory cells are provided to said second data line through said switching means, wherein turn-on and turn-off operations of said switching means are controlled by a second control signal;
   an amplifier circuit connected to said second data line for detecting the read signal appearing on the second data line; and a write circuit for applying a write signal to the memory cell, wherein said amplifier circuit includes at least a first bipolar transistor, a second bipolar transistor, and a current source, wherein at least a base of one of the first and second bipolar transistors is electrically coupled to the second data line, an emitter of each of the first and second bipolar transistors is electrically coupled to the current source, and a collector of each of the first and second bipolar transistors is electrically coupled to an output circuit, wherein said switching means is controlled to its turn-on condition by said second control signal after said amplifying and active restoring operations of said sense amplifier and active restore circuit means have been started by said first control signal, so that an amplified signal from said sense amplifier and active restore circuit means is transmitted to a base electrode of said one bipolar transistor of said amplifier circuit through said switching means and said second data line, wherein said output circuit includes a third bipolar transistor, an emitter of which is coupled to said collector of said first bipolar transistor, a fourth bipolar transistor, an emitter of which is coupled to said collector of said second bipolar transistor, a first load means coupled between a collector of said third bipolar transistor and an operating potential, a second load means coupled between a collector of said fourth bipolar transistor and said operating potential, a fifth bipolar transistor, a base of which is coupled to said collector of said third bipolar transistor and a collector of which is coupled to said operating potential, and a sixth bipolar transistor, a base of which is couple to said collector of said fourth bipolar transistor and a collector of which is coupled to said operating potential, wherein bases of said third and said fourth bipolar transistors are supplied with a predetermined bias voltage, and further wherein signals are obtained from emitters of said fifth and said sixth bipolar transistors.

2. A semiconductor dynamic memory according to claim 1, wherein a second switching means comprising an insulated-gate transistor is provided between said second data line and an input of said amplifier circuit, said second switching means being turned off during a write operation.

3. A semiconductor dynamic memory according to claim 1, wherein the output circuit controls a level of an output signal so as to output a desired signal level.

4. A semiconductor dynamic memory according to claim 1, wherein said second control signal ($\phi_y$) is applied to the switching means before a signal appearing on one of said data lines is amplified to $V_{CC} - V_{TH}$ so as to achieve high speed operation.

5. A semiconductor dynamic memory according to claim 1, wherein the output circuit operates as an ECL interface to connect the semiconductor dynamic memory to an ECL circuit.

* * * * *